United States Patent
Tsuji et al.

(10) Patent No.: US 11,791,284 B2
(45) Date of Patent: Oct. 17, 2023

(54) SEMICONDUCTOR DEVICE MANUFACTURING METHOD

(71) Applicant: DAICEL CORPORATION, Osaka (JP)

(72) Inventors: Naoko Tsuji, Tokyo (JP); Akira Yamakawa, Tokyo (JP); Katsuhiko Sumita, Tokyo (JP)

(73) Assignee: Daicel Corporation, Tokyo (JP)

( * ) Notice: Subject to any disclaimer, the term of this patent is extended or adjusted under 35 U.S.C. 154(b) by 312 days.

(21) Appl. No.: 17/286,712

(22) PCT Filed: Oct. 18, 2019

(86) PCT No.: PCT/JP2019/041189
§ 371 (c)(1),
(2) Date: Apr. 19, 2021

(87) PCT Pub. No.: WO2020/085251
PCT Pub. Date: Apr. 30, 2020

(65) Prior Publication Data
US 2021/0358867 A1 Nov. 18, 2021

(30) Foreign Application Priority Data

Oct. 23, 2018 (JP) .................................. 2018-199009

(51) Int. Cl.
*H01L 21/00* (2006.01)
*H01L 23/00* (2006.01)
(Continued)

(52) U.S. Cl.
CPC ...... *H01L 23/562* (2013.01); *H01L 21/76898* (2013.01); *H01L 23/481* (2013.01);
(Continued)

(58) Field of Classification Search
CPC combination set(s) only.
See application file for complete search history.

(56) References Cited

U.S. PATENT DOCUMENTS 8,415,202 B2  4/2013  Ohba
9,721,935 B2  8/2017  Kawasaki et al.
(Continued)

FOREIGN PATENT DOCUMENTS

JP  2015-176958 A  10/2015
JP  2016-4835 A   1/2016
(Continued)

OTHER PUBLICATIONS

International Search Report dated Jan. 7, 2020, in PCT/JP2019/041189.
(Continued)

*Primary Examiner* — Niki H Nguyen
(74) *Attorney, Agent, or Firm* — Birch, Stewart, Kolasch & Birch, LLP

(57) ABSTRACT

Provided is a method suitable for efficiently manufacturing a semiconductor device while preventing warpage of the wafer laminate in manufacturing a semiconductor device in which semiconductor elements are multilayered through laminating wafers in which the semiconductor elements are fabricated. The method includes at least: preparing a plurality of first wafer laminates each having a laminate configuration including a first and second wafers each having an element forming surface and a back surface opposite from the element forming surface, the laminate configuration wherein the element forming surface sides of the first and second wafers are bonded to each other; thinning the first wafer of the first wafer laminate to form a first wafer laminate having the thinned first wafer; and bonding the thinned first wafer sides of two first wafer laminates having (Continued)

undergone the thinning to each other to form a second wafer laminate.

20 Claims, 12 Drawing Sheets

(51) Int. Cl.
    *H01L 21/768*     (2006.01)
    *H01L 23/48*     (2006.01)
    *H01L 25/065*     (2023.01)
    *H01L 25/00*     (2006.01)

(52) U.S. Cl.
    CPC .............. *H01L 24/80* (2013.01); *H01L 24/83* (2013.01); *H01L 25/0657* (2013.01); *H01L 25/50* (2013.01); *H01L 2224/80895* (2013.01); *H01L 2224/80896* (2013.01); *H01L 2224/8385* (2013.01); *H01L 2225/06541* (2013.01); *H01L 2924/0715* (2013.01); *H01L 2924/3511* (2013.01)

(56) References Cited

U.S. PATENT DOCUMENTS

| | | | |
|---|---|---|---|
| 10,128,223 B2 | 11/2018 | Kawasaki et al. | |
| 2011/0165730 A1* | 7/2011 | Oh | B81C 1/00238 |
| | | | 438/107 |
| 2015/0262989 A1* | 9/2015 | Kawasaki | H01L 24/80 |
| | | | 257/737 |
| 2017/0287889 A1 | 10/2017 | Kawasaki et al. | |

FOREIGN PATENT DOCUMENTS

| | | |
|---|---|---|
| JP | 2016-178162 A | 10/2016 |
| WO | WO 2010/032729 A1 | 3/2010 |

OTHER PUBLICATIONS

Written Opinion of the International Searching Authority dated Jan. 7, 2020, in PCT/JP2019/041189.

\* cited by examiner

SEMICONDUCTOR DEVICE MANUFACTURING METHOD

TECHNICAL FIELD

The present invention relates to a method of manufacturing a semiconductor device having a laminated structure including a plurality of semiconductor elements. The present application claims priority to the Japanese Patent Application No. 2018-199009 filed in Japan on Oct. 23, 2018, the contents of which are incorporated herein.

BACKGROUND ART

In recent years, primarily for the purpose of further increasing the density of semiconductor devices, technology for manufacturing semiconductor devices having a three-dimensional structure in which a plurality of semiconductor chips or semiconductor elements are integrated in their thickness direction has been developed. One of such a technology widely known is a wafer-on-wafer (WOW) process. In the WOW process, a plurality of semiconductor elements are fabricated in a semiconductor wafer, and a predetermined number of such semiconductor wafers are sequentially laminated to form a structure in which the semiconductor elements are connected in their thickness direction, and the wafer laminate is divided into individual semiconductor devices through dicing. Technology relating to such a WOW process is described, for example, in Patent Documents 1 and 2 listed below.

CITATION LIST

Patent Document

Patent Document 1: WO 2010/032729
Patent Document 2: JP 2016-178162 A

SUMMARY OF INVENTION

Technical Problem

One technique known for sequentially laminating semiconductor wafers in the WOW process is a method including repeating a process of bonding a thinned wafer on a supporting wafer to another wafer and then removing the supporting wafer from the thinned wafer.

In this method, first, the supporting wafer and the semiconductor wafer are affixed together via a temporary adhesive. The semiconductor wafer has an element forming surface and a back surface opposite from the element forming surface, the element forming surface having a plurality of semiconductor elements formed thereon through transistor formation, wiring formation, or the like, and the semiconductor wafer is bonded at the element forming surface side to the supporting wafer via a temporary adhesive. The temporary adhesive is for achieving a temporary adhesion between the supporting wafer and the semiconductor wafer, and can be subsequently released.

Then, the semiconductor wafer on the supporting wafer is thinned by grinding from the back surface side. Then, the thinned wafer thus formed is affixed to a predetermined base wafer or another thinned wafer laminated in advance on the base wafer, for example, via adhesive (wafer laminating). Then, the temporary adhesion between the supporting wafer and the thinned wafer is released, and the supporting wafer is removed leaving the thinned wafer on the base wafer side. Thereafter, the thinned wafer surface after the supporting wafer is removed is cleaned.

By repeating a series of processes as described above, a plurality of thin semiconductor wafers can be laminated on the base wafer.

However, according to such a method, a wafer laminate having an asymmetric laminate configuration in the thickness direction is formed. In the bonding mode between the thinned wafers sequentially laminated by the method described above, the element forming surface of the thinned wafer, which has been laminated in advance on the base wafer, and the back surface of the thinned wafer, which is accompanied by the supporting wafer and further laminated, are bonded. That is, the bonding mode is a face-to-back bonding. In the wafer laminate to be formed, such a bonding mode is repeated in the lamination direction. That is, the wafer laminate to be formed has a laminate configuration asymmetric in the thickness direction. Wafer laminates having an asymmetric laminate configuration are prone to warping. The degree of this warpage tends to accumulate and increase as the total number of wafers (i.e., the total number of wafer-to-wafer bonding) of the wafer laminate increases. The warpage of the wafer laminate is not preferred in performing various processing on the wafer laminate with high precision.

In addition, the method described above requires temporary adhering of the supporting wafer, which is not included in the wafer laminate that is to be formed, to the semiconductor wafer to be formed, removal of the supporting wafer, and further cleaning after the removing. The implementation of these processes is not preferred in terms of reducing manufacturing costs, such as capital investment costs and costs of materials to be used. The implementation of these processes is also not preferred in terms of reducing the number of processes in the manufacturing process.

The present invention was conceived under the circumstances as described above, and an object of the present invention is to provide a technique suitable for efficiently manufacturing a semiconductor device while preventing warpage of the wafer laminate in a method of manufacturing a semiconductor device, the method in which semiconductor elements are multilayered through laminating wafers in which the semiconductor elements are fabricated.

Solution to Problem

A method of manufacturing a semiconductor device, the method provided by the present invention, includes at least: preparing, thickness reduction, and bonding as described below. In the preparing, a required number of a plurality of first wafer laminates are prepared. Each of the first wafer laminates has a laminate configuration in which a first wafer having an element forming surface and a back surface opposite from the element forming surface, and a second wafer having an element forming surface and a back surface opposite from the element forming surface are included, the element forming surface sides of these first and second wafers are bonded to each other, for example, via an adhesive layer or by direct bonding. The first wafer and the second wafer each are wafers having a semiconductor wafer main body in which a semiconductor element can be fabricated, and the element forming surface is a surface on a side on which a plurality of semiconductor elements are formed through transistor formation and if necessary wiring formation or the like. In performing thickness reduction, the first wafer of the first wafer laminate is thinned, and a first wafer laminate having the thinned first wafer is formed. Such thickness reduction is performed for each first wafer laminate and performed at least twice (i.e., a required number of times of twice or more). In the bonding, the thinned first wafers of two first wafer laminates having undergone the thickness reduction are bonded to each other, for example, via an adhesive layer or by direct bonding, and a second wafer laminate is formed.

In the bonding of the present method of manufacturing a semiconductor device, the thinned first wafers of two first wafer laminates having undergone the thickness reduction are bonded as described above. These first wafer laminates each have a laminate configuration including the second wafer in addition to the thinned first wafer. Thus, the second wafer laminate formed by the bonding has a laminate configuration symmetric in the thickness direction, the laminate configuration including two second wafers and two thinned first wafers interposed between the second wafers with the element forming surface sides of the first and second wafers bonded to each other. Wafer laminates having a laminate configuration symmetric in the thickness direction are less likely to warp. Thus, the present method of manufacturing a semiconductor device is suitable for manufacturing a semiconductor device while preventing warpage of the wafer laminate.

In addition, the present method of manufacturing a semiconductor device does not use the supporting wafer, which is not included in the wafer laminate to be formed, in the thickness reduction and the subsequent lamination of the wafer having the element forming surface. Thus, the present method of manufacturing a semiconductor device does not require the temporary adhering of the supporting wafer, the removal of the supporting wafer, and the subsequent cleaning of the thinned wafer surface described above with respect to other methods. Such a configuration is suitable for efficiently manufacturing a semiconductor device. Such a configuration is preferred specifically in terms of reducing manufacturing costs, such as capital investment costs and costs of materials to be used, and reducing the number of processes in the manufacturing process.

As described above, the present method of manufacturing a semiconductor device is suitable for efficiently manufacturing a semiconductor device while preventing warpage of the wafer laminate.

The present method of manufacturing a semiconductor device preferably further includes forming a through electrode in the second wafer laminate. The through electrode formed in this through electrode forming extends through an inside of the second wafer laminate formed in the thickness reduction described above, from a back surface of a second wafer located at one end in the lamination direction in the second wafer laminate to an element forming surface of a second wafer located at another end in the lamination direction in the second wafer laminate. More preferably, the present method of manufacturing a semiconductor device further includes performing thickness reduction to the second wafer located at the one end in the lamination direction in the second wafer laminate prior to such a through electrode forming. These configurations allow the semiconductor elements to be appropriately electrically connected at short distances in a semiconductor device to be manufactured. Thus, these configurations are suitable for achieving an efficient digital signal processing, for reducing attenuation of the high-frequency signal, and also for reducing power consumption in a semiconductor device to be manufactured.

The present method of manufacturing a semiconductor device preferably further includes performing additional thickness reduction and a subsequent additional bonding performed for each of the additional thickness reduction. In the additional thickness reduction, a second wafer located at one end in the lamination direction in the second wafer laminate is thinned, and a second wafer laminate having the thinned second wafer is formed. In the subsequent additional bonding, the thinned first wafer of the first wafer laminate having undergone the thickness reduction described above is bonded to the thinned second wafer of the second wafer laminate via an adhesive layer or by direct bonding, and a second wafer laminate having an increased number of wafers is formed. The second wafer laminate subjected to the additional thickness reduction is the second wafer laminate formed in the bonding described above, or the second wafer laminate having undergone the preceding additional thickness reduction and the subsequent additional bonding.

The second wafer laminate formed through such an additional thickness reduction and a subsequent additional bonding has a laminate configuration having six or more laminated wafers and symmetric in the thickness direction. In addition, in these additional thickness reduction and additional bonding, the thickness reduction and the subsequent lamination of the wafer having the element forming surface do not require the temporary adhering of the supporting wafer, the removal of the supporting wafer, and the subsequent cleaning of the thinned wafer surface described above with respect to other methods. Thus, the configuration of the present method of manufacturing a semiconductor device, the method including the additional thickness reduction and the additional bonding as described above, is suitable for efficiently manufacturing a semiconductor device having six or more laminated semiconductor elements while preventing warpage of the wafer laminate.

The present method of manufacturing a semiconductor device preferably further includes forming a through electrode in the second wafer laminate after the additional bonding. The through electrode formed in this through electrode forming extends through an inside of the second wafer laminate formed in the additional thickness reduction described above from a back surface of a second wafer located at one end in the lamination direction in the second wafer laminate to an element forming surface of a second wafer located at another end in the lamination direction in the second wafer laminate. More preferably, the present method of manufacturing a semiconductor device further includes, prior to such a through electrode forming, performing thickness reduction to the second wafer located at the one end in the lamination direction in the second wafer laminate after the additional bonding. These configurations allow six or more laminated semiconductor elements to be appropriately electrically connected at short distances in a semiconductor device to be manufactured. Thus, these configurations are suitable for achieving an efficient digital signal processing, for reducing attenuation of the high-frequency signal, and also for reducing power consumption in a semiconductor device to be manufactured.

The present method of manufacturing a semiconductor device preferably further includes, after the through electrode forming described above, performing thickness reduction to the second wafer located at the other end in the lamination direction in the second wafer laminate. Such a configuration is suitable for reducing the thickness of a semiconductor device to be manufactured.

DESCRIPTION OF EMBODIMENTS

Figure 1:
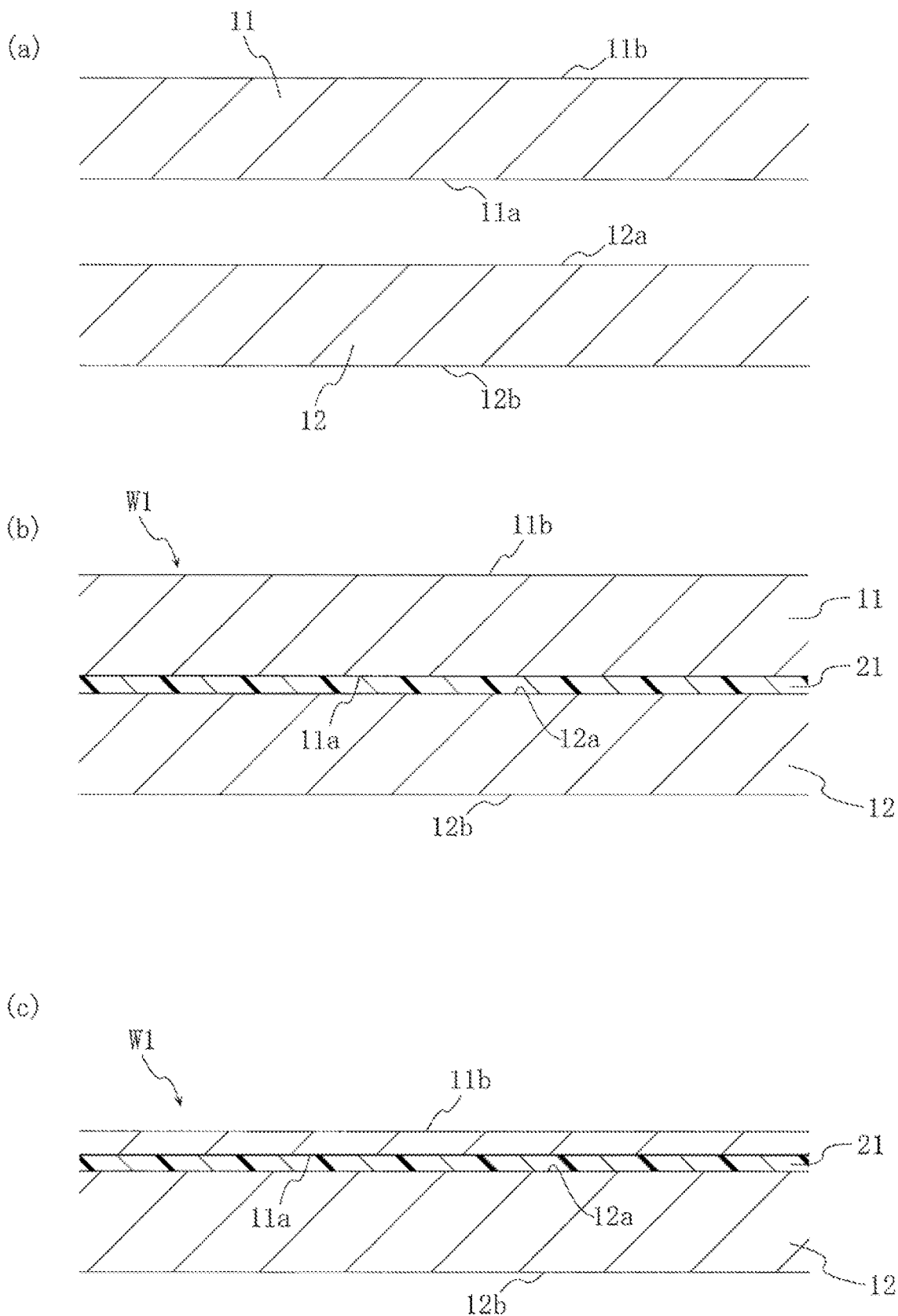
FIG. 1 illustrates some processes in a method of manufacturing a semiconductor device according to an embodiment of the present invention.
Figure 2:
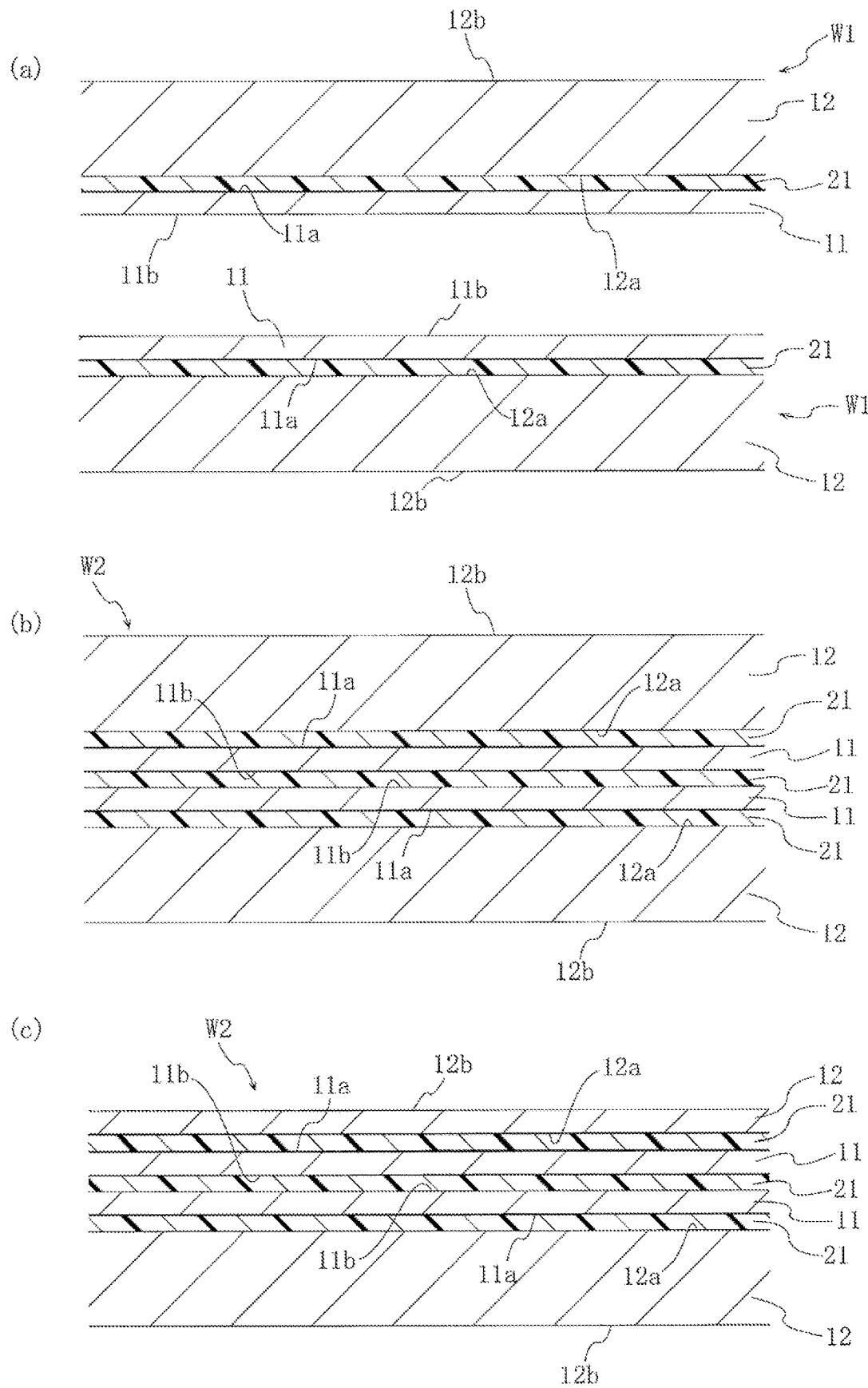
FIG. 2 illustrates some processes in a method of manufacturing a semiconductor device according to an embodiment of the present invention.
Figure 3:
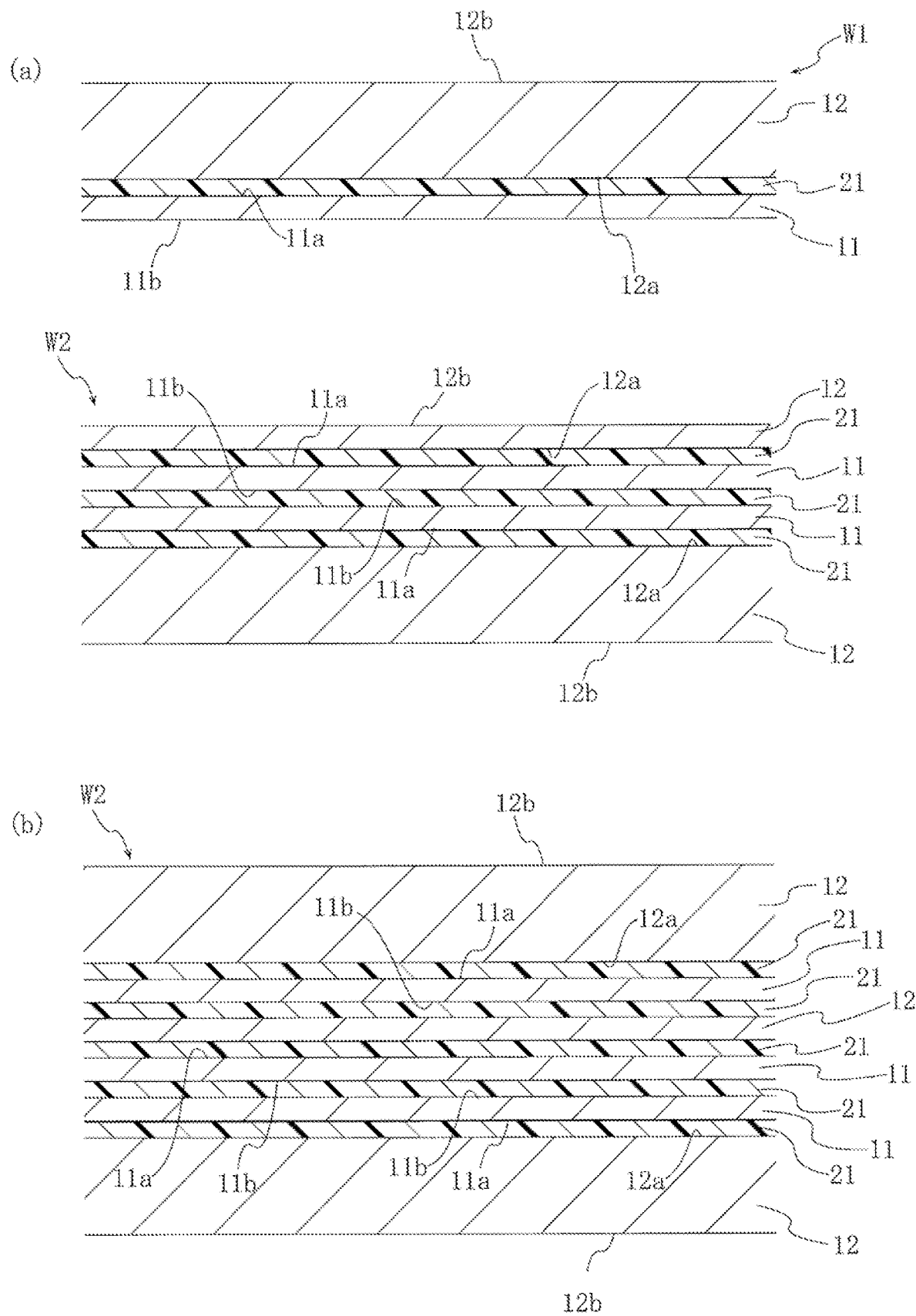
FIG. 3 illustrates some processes in a method of manufacturing a semiconductor device according to an embodiment of the present invention.

FIG. 1 to FIG. 6 illustrate a method of manufacturing a semiconductor device according to an embodiment of the present invention. This manufacturing method is a method for manufacturing a semiconductor device having a three-dimensional structure in which semiconductor elements are integrated in their thickness direction, and each of FIG. 1 to FIG. 6 illustrates a manufacturing process in a partial cross-sectional view(s).

In the present method of manufacturing a semiconductor device, first, a wafer 11 and a wafer 12 are bonded via an adhesive, and a wafer laminate W1 is produced, as illustrated in FIG. 1(a) and FIG. 1(b). The wafer laminate W1 has a laminated structure including the wafers 11 and 12, and an adhesive layer 21 between the wafers 11 and 12. In the present method, a required number of such wafer laminates W1 are prepared.

The wafer 11 is a wafer having a semiconductor wafer main body in which a semiconductor element can be fabricated, and has an element forming surface 11a and a back surface 11b opposite from the element forming surface 11a. The element forming surface 11a is a surface on a side on which a plurality of semiconductor elements (not illustrated) are formed through transistor formation, wiring formation, or the like. In the present embodiment, each semiconductor element has a multilayered wiring structure portion, which includes an exposed electrode pad, on a surface. Examples of a constituent material for forming the semiconductor wafer main body of the wafer 11 include silicon (Si), germanium (Ge), silicon carbide (SiC), gallium arsenide (GaAs), gallium nitride (GaN), and indium phosphide (InP). The thickness of the wafer 11 is, for example, from 500 to 1000 μm.

The wafer 12 is a wafer having a semiconductor wafer main body in which a semiconductor element can be fabricated, and has an element forming surface 12a and a back surface 12b opposite from the element forming surface 12a. The element forming surface 12a is a surface on a side on which a plurality of semiconductor elements (not illustrated) are formed through transistor formation, wiring formation, or the like. In the present embodiment, each semiconductor element has a multilayered wiring structure portion, which includes an exposed electrode pad, on a surface. Examples of a constituent material for forming the semiconductor wafer main body of the wafer 12 include the materials listed above as a constituent material for forming the semiconductor wafer main body of the wafer 11. The thickness of such the wafer 12 is, for example, from 500 to 1000 μm.

The element forming surfaces 11a and 12a of these wafers 11 and 12 are bonded to each other, and the wafer laminate W1 is produced (bonded face-to-face).

The adhesive layer 21 contains a thermosetting adhesive in the present embodiment. Examples of a main component for forming the thermosetting adhesive include polyorganosilsesquioxane, a benzocyclobutene (BCB) resin, and a novolac epoxy resin. In terms of providing good heat resistance and crack resistance that can withstand the temperature environment in the semiconductor device manufacturing process, a polyorganosilsesquioxane-containing thermosetting adhesive is preferably employed in forming the adhesive layer 21. As the polyorganosilsesquioxane-containing thermosetting adhesive, the adhesive described in, for example, WO 2016/204114 can be employed. In addition, the thickness of the adhesive layer 21 is, for example, from 0.5 to 20 μm.

The bonding between the wafers 11 and 12 can be performed, for example, as follows. First, an adhesive composition is coated on the element forming surface of one wafer, for example, by spin coating to form an adhesive composition layer. Then, the composition layer is heated to be dried and solidified. Thus, the composition layer is completely cured to be an adhesive layer that is to form the adhesive layer 21. Prior to coating the adhesive, the element forming surface 11a side of the wafer 11 and/or the element forming surface 12a side of the wafer 12 may be surface-treated with a silane coupling agent or the like to improve adhesion with the adhesive layer 21 to be formed. In the bonding between the wafers 11 and 12, the wafer 11 and the wafer 12 are then affixed together via an adhesive layer provided between the wafers 11 and 12 under application of pressure and, if necessary, under heating. In this affixing, the pressure is, for example, from 300 to 5000 g/cm², and the temperature is, for example, from 30 to 200° C. Then, the adhesive layer provided between the wafers 11 and 12 is cured by heating to form the adhesive layer 21. In this heating, the heating temperature is, for example, from 30 to 200° C., and the heating time is, for example, from 5 to 120 minutes. For example, as described above, the wafers 11 and 12 are bonded via the adhesive layer 21.

In the present embodiment, the wafer 11 of the wafer laminate W1 is then thinned as illustrated in FIG. 1(c) (thickness reduction). This forms a wafer laminate W1 having the thinned wafer 11. In the present thickness reduction, the wafer 11 is thinned to a predetermined thickness, for example, by grinding on the back surface 11b side of the wafer 11. The thickness of the wafer 11 after the thickness reduction is, for example, from 1 to 20 μm.

In the present method of manufacturing a semiconductor device, such thickness reduction is performed a required number of times of twice or more, and a required number of wafer laminates W1 having the thinned wafer 11 is prepared.

In the present embodiment, then, as illustrated in FIG. 2(a) and FIG. 2(b), the wafers 11 (thinned wafers) of two wafer laminates W1 having undergone the thickness reduction are bonded to each other via the adhesive layer 21, and a wafer laminate W2 is formed (bonding). As described above, the adhesive layer 21 contains a thermosetting adhesive in the present embodiment, and the thickness of the adhesive layer 21 is, for example, from 0.5 to 20 μm. In the present bonding, the back surfaces 11b of the wafers 11 (thinned wafers) in the two wafer laminates W1 are bonded to each other, and the wafer laminate W2 is formed (bonded back-to-back).

This bonding can be performed, for example, as follows. First, an adhesive composition is coated on the back surface 11b of the thinned wafer 11 in one wafer laminate W1, for example, by spin coating to form an adhesive composition layer. Then, the composition layer is heated to be dried and solidified. Thus, the composition layer is completely cured to be an adhesive layer that is to form the adhesive layer 21. Prior to coating the adhesive, the back surface 11b side of the wafer 11 in one wafer laminate W1 and/or the back surface 11b side of the wafer 11 in the other wafer laminate W1 may be surface-treated with a silane coupling agent or the like to improve adhesion with the adhesive layer 21 to be formed. In the present bonding, one wafer laminate W1 or the thinned wafer 11 of the one wafer laminate W1 and the other wafer laminate W1 or the thinned wafer 11 of the other wafer laminate W1 are then affixed together via an adhesive layer provided between these wafer laminates W1 or their thinned wafers 11 under application of pressure and, if necessary, under heating. In this affixing, the pressure is, for example, from 300 to 5000 g/cm$^2$, and the temperature is, for example, from 30 to 200° C. Then, the adhesive layer provided between the wafer laminates W1, W1 is cured by heating to form the adhesive layer 21. In this heating, the heating temperature is, for example, from 30 to 200° C., and the heating time is, for example, from 5 to 120 minutes. For example, as described above, the wafer laminates are bonded via the adhesive layer 21.

In the present embodiment, a wafer 12 located at one end in the lamination direction in the wafer laminate W2 is then thinned as illustrated in FIG. 2(c) (additional thickness reduction). This forms a wafer laminate W2 having the thinned wafer 12. In the present additional thickness reduction, one wafer 12 is thinned to a predetermined thickness, for example, by grinding on the back surface 12b side of the one wafer 12. The thickness of the wafer 12 after thickness reduction is, for example, from 1 to 20 μm.

In the present embodiment, then, as illustrated in FIG. 3(a) and FIG. 3(b), the thinned wafer 11 of the wafer laminate W1 having undergone the thickness reduction described above with reference to FIG. 1(c) is bonded via the adhesive layer 21 to the thinned wafer 12 of the wafer laminate W2 having undergone the additional thickness reduction (additional bonding). This forms a wafer laminate W2 having an increased number of wafer layers. As described above, the adhesive layer 21 contains a thermosetting adhesive in the present embodiment, and the thickness of the adhesive layer 21 is, for example, from 0.5 to 20 μm.

This additional bonding can be performed, for example, as follows. First, an adhesive composition is coated on the back surface of the thinned wafer in one wafer laminate, for example, by spin coating to form an adhesive composition layer. Then, the composition layer is heated to be dried and solidified. Thus, the composition layer is completely cured to be an adhesive layer that is to form the adhesive layer 21. Prior to coating the adhesive, the back surface 11b side of the wafer 11 of the wafer laminate W1 and/or the back surface 12b side of the wafer 12 of the wafer laminate W2 may be surface-treated with a silane coupling agent or the like to improve adhesion with the adhesive layer 21 to be formed. In the present additional bonding, the wafer laminate W2 or the thinned wafer 12 of the wafer laminate W2 and the wafer laminate W1 or the thinned wafer 11 of the wafer laminate W1 are then affixed together via an adhesive layer provided between the wafer laminate W2 and the wafer laminate W1 under application of pressure and, if necessary, under heating. In this affixing, the pressure is, for example, from 300 to 5000 g/cm$^2$, and the temperature is, for example, from 30 to 200° C. Then, the adhesive layer provided between the wafer laminates W1 and W2 is cured by heating to form the adhesive layer 21. In this heating, the heating temperature is, for example, from 30 to 200° C., and the heating time is, for example, from 5 to 120 minutes. For example, as described above, the wafer laminates are bonded via the adhesive layer 21.

Figure 4:
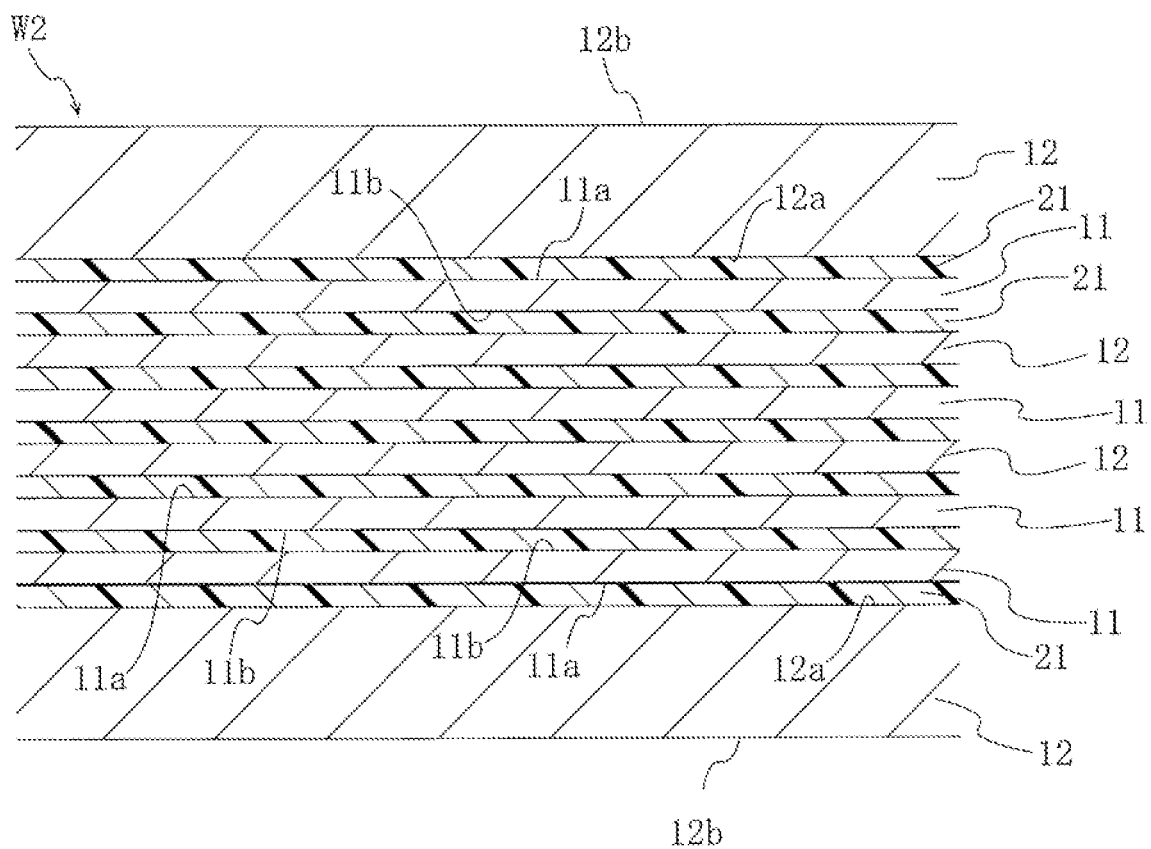
FIG. 4 illustrates some processes in a method of manufacturing a semiconductor device according to an embodiment of the present invention.
Figure 5:
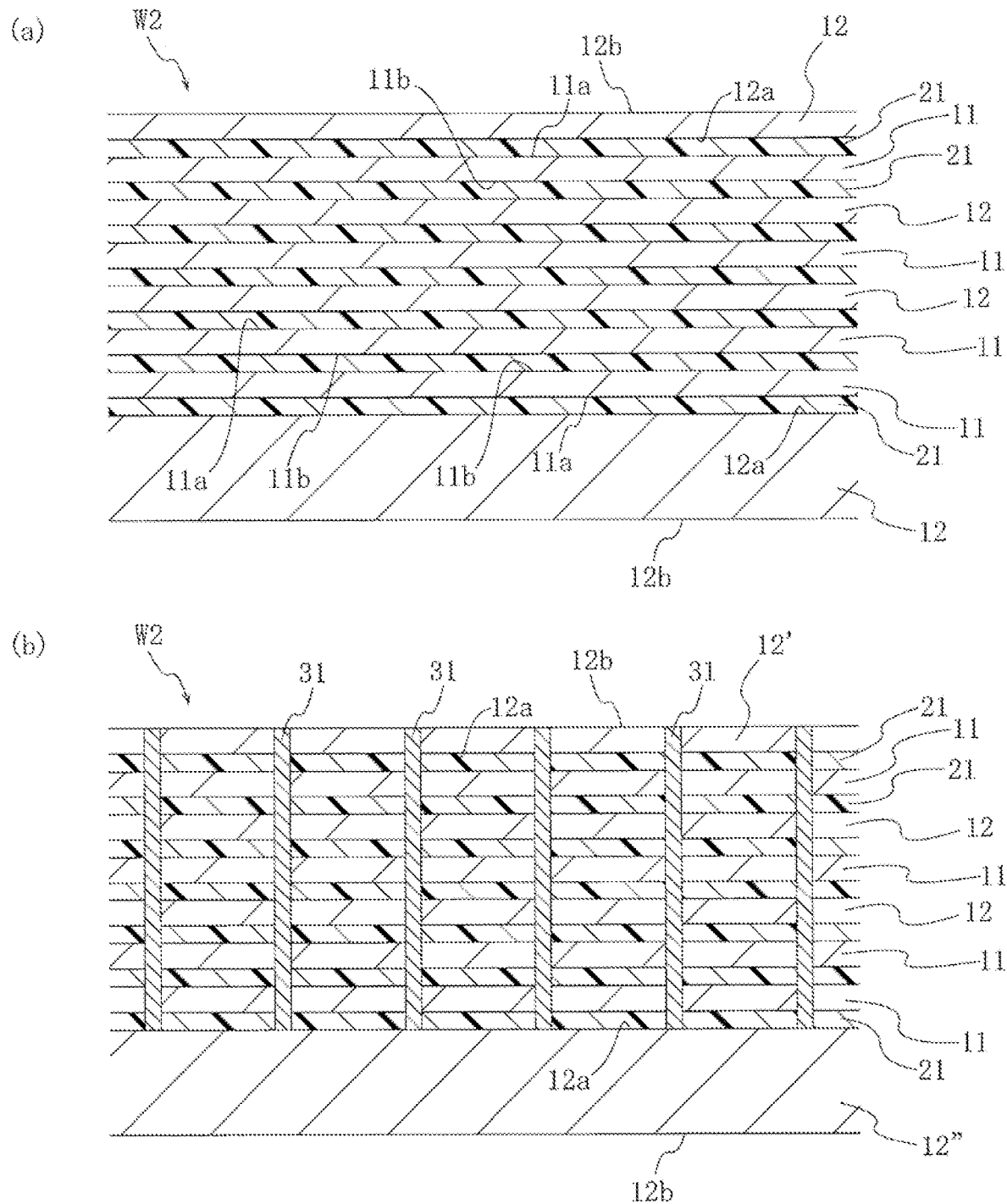
FIG. 5 illustrates some processes in a method of manufacturing a semiconductor device according to an embodiment of the present invention.

In the present method of manufacturing a semiconductor device, a series of processes including the additional thickness reduction (thickness reduction of a wafer 12 at one end of the wafer laminate W2) described above with reference to FIG. 2(c) and the additional bonding (further multilayering of the wafer laminate W2) described above with reference to FIG. 3(a) and FIG. 3(b) is performed a predetermined number of times according to the number of semiconductor elements laminated in a semiconductor device to be manufactured. For each additional thickness reduction, a subsequent additional bonding is performed. FIG. 4 illustrates, as an example, a wafer laminate W2 obtained by performing the series of processes twice.

In the present embodiment, a wafer 12 located at one end in the lamination direction in the wafer laminate W2 is then thinned as illustrated in FIG. 5(a). In the present thickness reduction, one wafer 12 is thinned to a predetermined thickness, for example, by grinding on the back surface 12b side of the one wafer 12. The thickness of the wafer 12 after thickness reduction is, for example, from 1 to 20 μm.

Then, as illustrated in FIG. 5(b), a through electrode 31 is formed (through electrode forming). The through electrode 31 is to electrically connect semiconductor elements formed in different wafers in the wafer laminate W2. Specifically, the through electrode 31 extends through an inside of the wafer laminate W2 from a back surface 12b of a wafer 12 (wafer 12') located at one end (the upper end in FIG. 5(b)) in the lamination direction in the wafer laminate W2 to an element forming surface 12a of a wafer 12 (wafer 12") located at another end (the lower end in FIG. 5(b)) in the lamination direction in the wafer laminate W2. Such a through electrode 31 can be formed, for example, through: forming an opening from the wafer 12' side in the wafer laminate W2 to the element forming surface 12a of the wafer 12"; forming an insulating film (not illustrated) on an inner wall surface of the opening; forming a barrier layer (not illustrated) on the insulating film surface; forming a seed layer for electroplating (not illustrated) on the barrier layer surface; and filling the opening with a conductive material, such as copper, by an electroplating method. In addition, a technique described, for example, in JP 2016-004835 A may be employed to form the through electrode 31.

Figure 6:
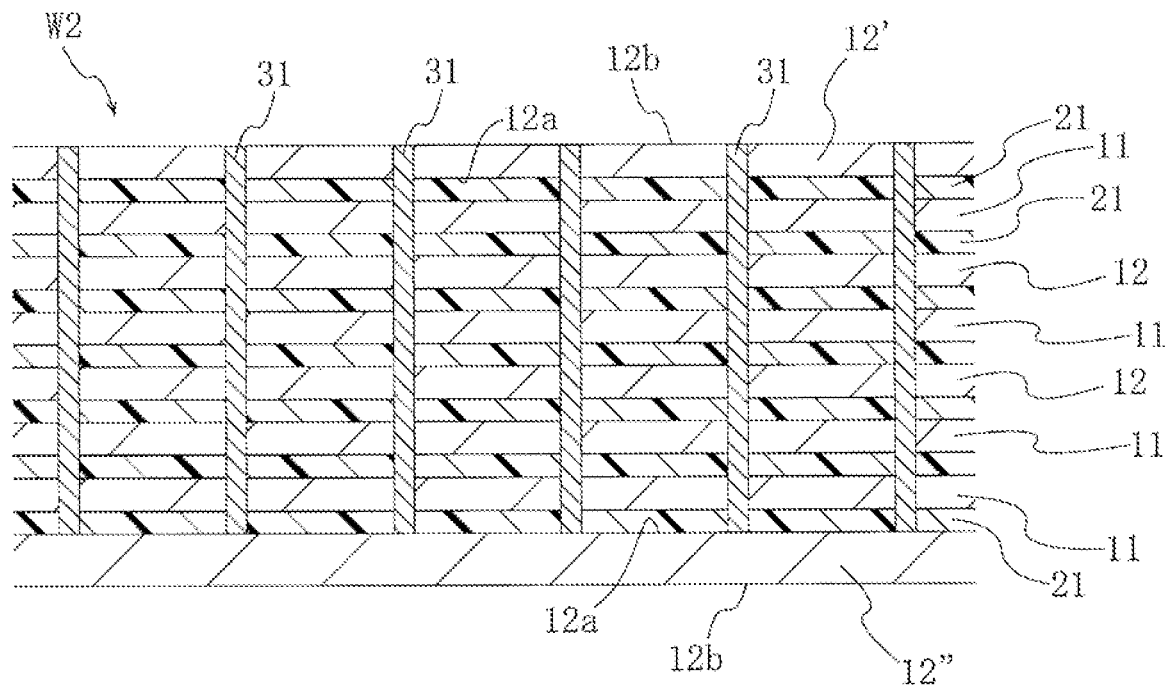
FIG. 6 illustrates some processes in a method of manufacturing a semiconductor device according to an embodiment of the present invention.
Figure 7:
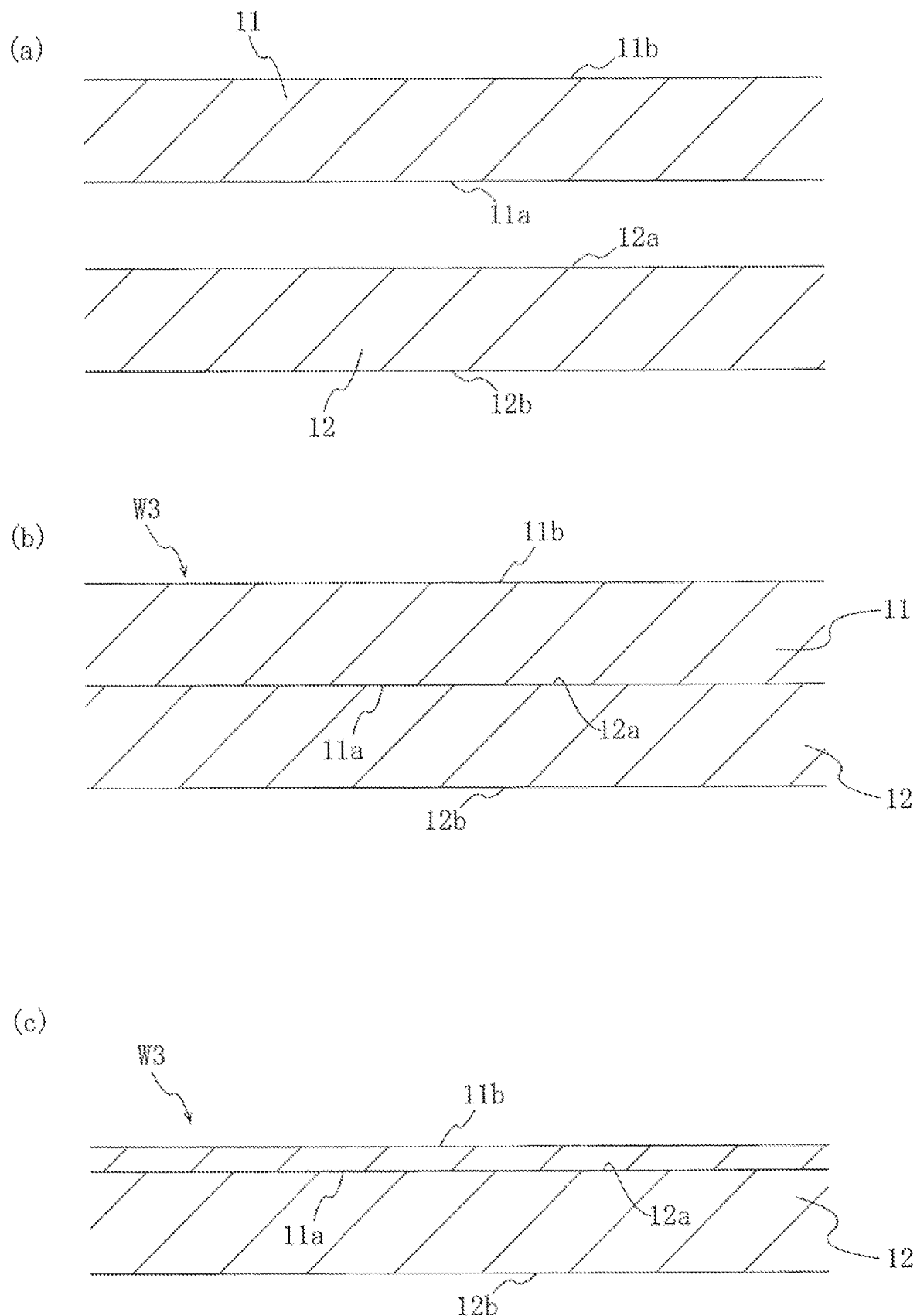
FIG. 7 illustrates some processes in a method of manufacturing a semiconductor device according to an embodiment of the present invention.
Figure 8:
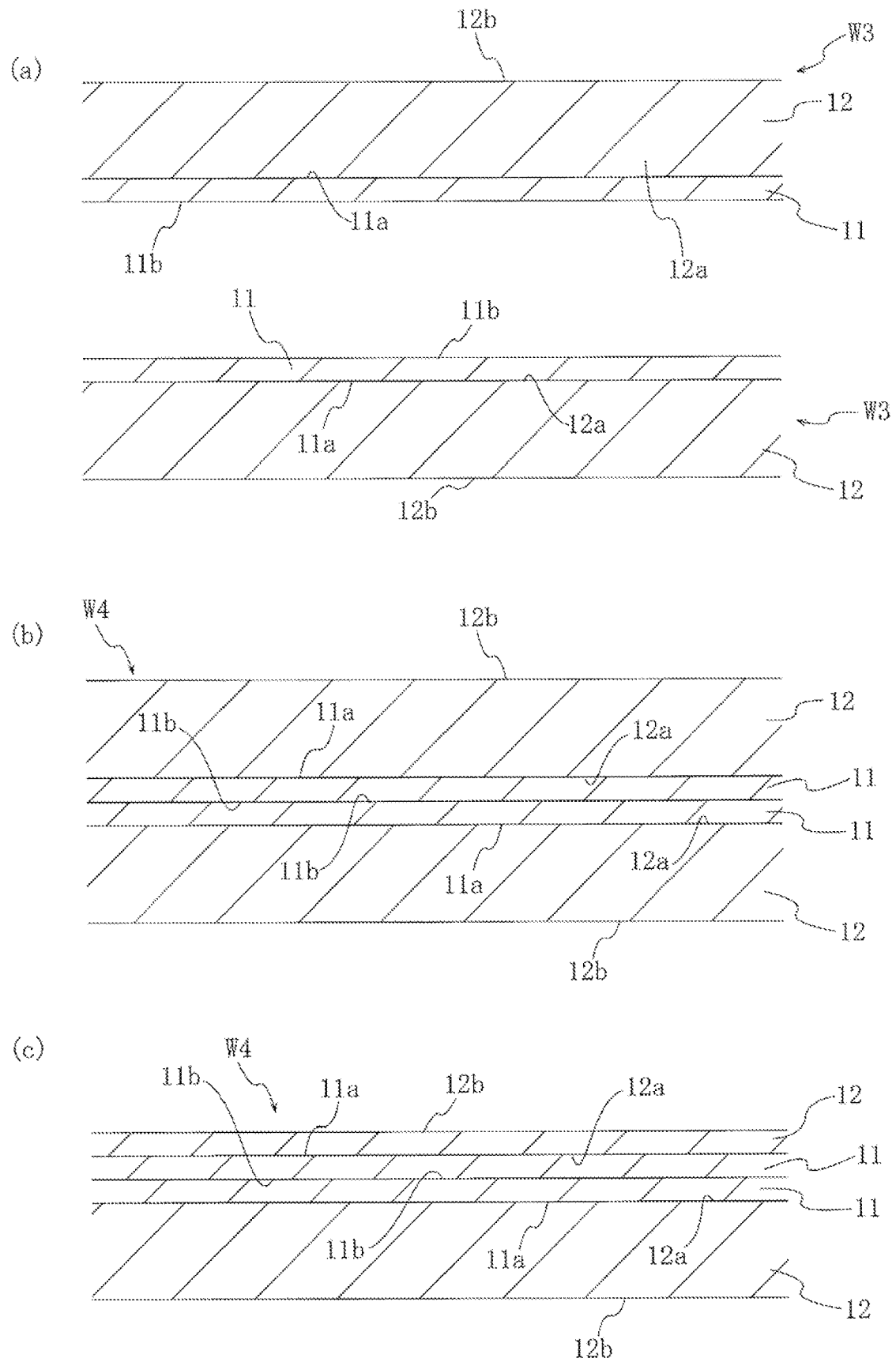
FIG. 8 illustrates some processes in a method of manufacturing a semiconductor device according to an embodiment of the present invention.
Figure 9:
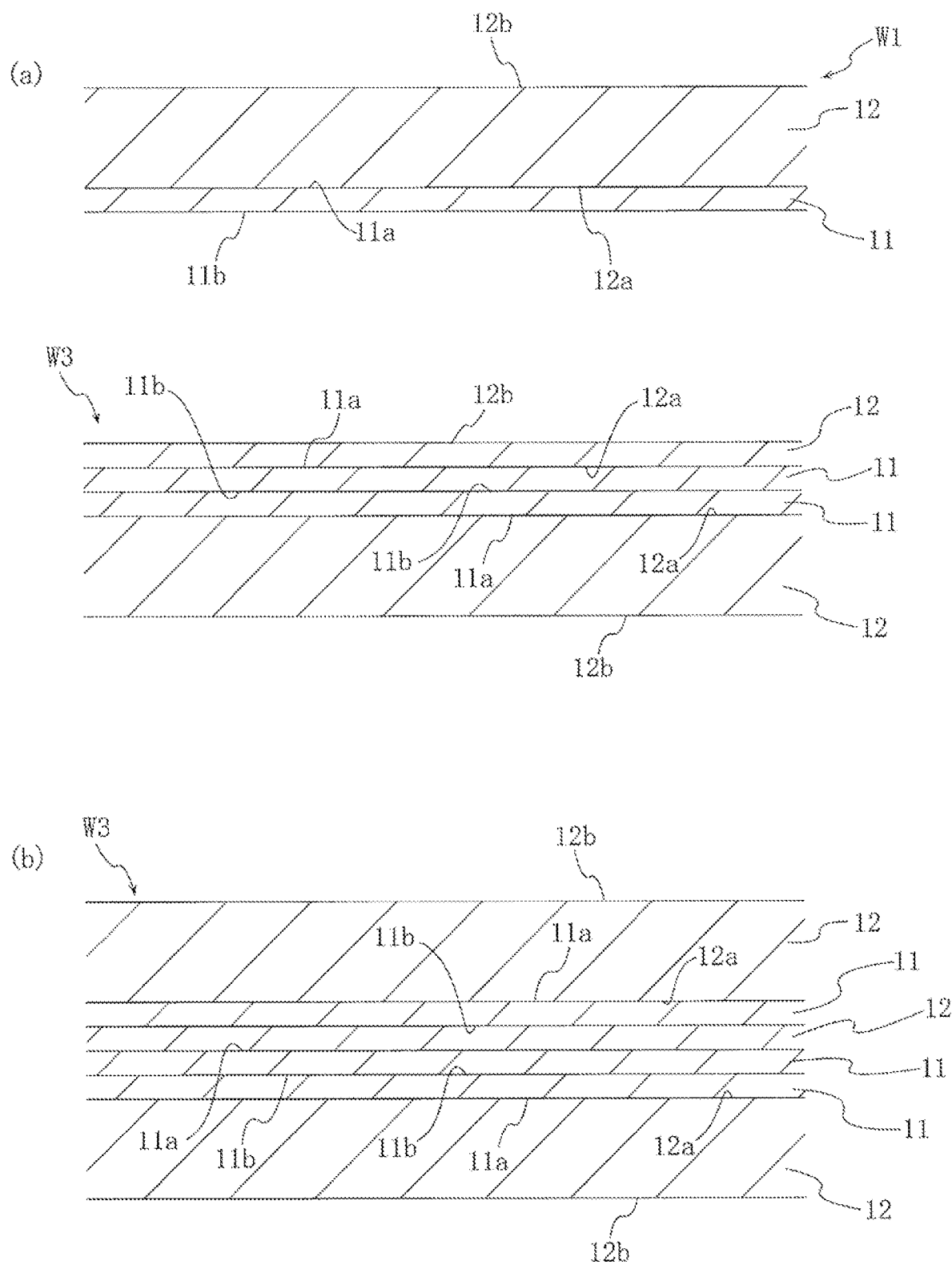
FIG. 9 illustrates some processes in a method of manufacturing a semiconductor device according to an embodiment of the present invention.

In the present embodiment, the wafer 12" in the wafer laminate W2 is then thinned as illustrated in FIG. 6. In the present thickness reduction, the wafer 12" is thinned to a predetermined thickness, for example, by grinding on the back surface 12b side of the wafer 12". The thickness of the wafer 12" after thickness reduction is, for example, from 5 to 400 μm. The present thickness reduction is preferably performed to reduce the thickness of a semiconductor device to be manufactured.

Thereafter, an external connection bump (not illustrated) may be formed on the back surface 12b side of the wafer 12' in the wafer laminate W2 (external connection bump forming). Alternatively, a through electrode (not illustrated) may be formed, where the through electrode extends through the wafer 12" in the wafer laminate W2 in the thickness direction, and is electrically connected to a multilayered wiring structure portion on the element forming surface 12a side of the wafer 12". And an external connection bump (not illustrated) may be formed on the back surface 12b side of the wafer 12", where the external connection bump is electrically connected to the through electrode.

As described above, the semiconductor device having a three-dimensional structure in which semiconductor elements are integrated in their thickness direction can be manufactured. This semiconductor device may be divided into individual pieces by dicing. In addition, in the present method of manufacturing a semiconductor device, after the process described above with reference to FIG. 2(c), the through electrode forming described above with reference to FIG. 5(b) and the process described above with reference to FIG. 6 may be performed without undergoing further multilayering of the wafer laminate W2. Thereafter, an external connection bump may be formed.

In the bonding of the present method of manufacturing a semiconductor device, the thinned wafers 11 of two wafer laminates W1 having undergone the thickness reduction described above with reference to FIG. 1(c) are bonded to each other via the adhesive layer 21. These wafer laminates W1 each have a laminate configuration including the wafer 12 in addition to the thinned wafer 11. Thus, the wafer laminate W2 formed by the bonding has a laminate configuration symmetric in the thickness direction, the laminate configuration including two wafers 12 and two thinned wafers 11 interposed between the wafers 12 with the element forming surfaces 11a and 12a bonded to each other. The wafer laminate W2 having the laminate configuration symmetric in the thickness direction is less likely to warp. Thus, the present method of manufacturing a semiconductor device is suitable for manufacturing a semiconductor device while preventing warpage of the wafer laminate.

In addition, in at least one additional bonding in the present method of manufacturing a semiconductor device, the thinned wafer 11 of the wafer laminate W1 having undergone the thickness reduction described above with reference to FIG. 1(c) is bonded via the adhesive layer 21 to the thinned wafer 12 of the wafer laminate W2 having undergone the additional thickness reduction described above with reference to FIG. 2(c). The wafer laminate W2 formed by each additional bonding also has a laminate configuration symmetric in the thickness direction and is less likely to warp. Thus, the present method of manufacturing a semiconductor device is suitable for manufacturing a semiconductor device while preventing warpage of the wafer laminate.

In addition, the present method of manufacturing a semiconductor device does not use a supporting wafer, which is not included in the wafer laminate to be formed, in the thickness reduction and the subsequent lamination of the wafer 11 having the element forming surface 11a. Thus, the present method of manufacturing a semiconductor device does not require the temporary adhering of the supporting wafer, the removal of the supporting wafer, and the subsequent cleaning of the thinned wafer surface described above with respect to other methods. Such a configuration is preferred in terms of reducing manufacturing costs, such as capital investment costs and costs of materials to be used, and reducing the number of processes in the manufacturing process, and suitable for efficiently manufacturing a semiconductor device.

As described above, the present method of manufacturing a semiconductor device is suitable for efficiently manufacturing a semiconductor device while preventing warpage of the wafer laminate.

In the present method of manufacturing a semiconductor device, as described above, the through electrode 31 is formed where the through electrode 31 extends through an inside of the wafer laminate W2 from the back surface 12b of the thinned wafer 12' located at one end in the lamination direction in the wafer laminate W2 to the element forming surface 12a of the wafer 12" located at another end in the lamination direction in the wafer laminate W2. Such a through electrode 31 can appropriately electrically connect the semiconductor elements at short distances in a semiconductor device to be manufactured. Thus, the formation of the through electrode 31 is suitable for achieving an efficient digital signal processing, for reducing attenuation of the high-frequency signal, and also for reducing power consumption in a semiconductor device to be manufactured.

FIG. 7 to FIG. 12 illustrate a method of manufacturing a semiconductor device according to another embodiment of the present invention. This manufacturing method is a method for manufacturing a semiconductor device having a three-dimensional structure in which semiconductor elements are integrated in their thickness direction, and each of FIG. 7 to FIG. 12 illustrates a manufacturing process in a partial cross-sectional view(s).

In the present method of manufacturing a semiconductor device, first, a wafer 11 and a wafer 12 are directly bonded, and a wafer laminate W3 is produced as illustrated in FIG. 7(a) and FIG. 7(b). The wafer 11 and 12 are the same as the wafer 11 and 12 in the embodiment described above. Specifically, the wafer 11 has an element forming surface 11a and a back surface 11b opposite from the element forming surface 11a, and the wafer 12 has an element forming surface 12a and a back surface 12b opposite from the element forming surface 12a. The element forming surfaces 11a and 12a are sides of the surfaces on which a plurality of semiconductor elements (not illustrated) are formed through transistor formation, wiring formation, or the like, and each semiconductor element has a multilayered wiring structure portion, which includes an exposed electrode pad, on a surface. The element forming surfaces 11a and 12a of these wafers 11 and 12 are bonded to each other, and the wafer laminate W3 is produced (bonded face-to-face).

Specifically, in the production of the wafer laminate W3, the element forming surface 11a side of the wafer 11 and the element forming surface 12a side of the wafer 12 are directly bonded. The direct bonding refers to a bonding technique in which no resin adhesive material is used. Examples of the direct bonding include what is called normal temperature bonding, oxide film direct bonding via an oxide film provided on a wafer surface, such as an element forming surface, and inter-electrode direct bonding (e.g., Cu—Cu bonding between Cu electrode pads) for a wafer surface having an exposed electrode. The same applies to the direct bonding described below.

In the present embodiment, the wafer 11 of the wafer laminate W3 is then thinned as illustrated in FIG. 7(c) (thickness reduction). This forms a wafer laminate W3 having the thinned wafer 11. In the present thickness reduction, the wafer 11 is thinned to a predetermined thickness, for example, by grinding on the back surface 11b side of the wafer 11. The thickness of the wafer 11 after thickness reduction is, for example, from 1 to 20 µm.

In the present method of manufacturing a semiconductor device, such thickness reduction is performed a required number of times of twice or more, and a required number of wafer laminates W3 having the thinned wafer 11 is prepared.

In the present embodiment, then, as illustrated in FIG. 8(a) and FIG. 8(b), the wafers 11 (thinned wafers) of two wafer laminates W3 having undergone the thickness reduction are bonded to each other by direct bonding, and a wafer laminate W4 is formed (bonding). In the present bonding, the back surfaces 11b of the wafers 11 (thinned wafers) in the two wafer laminates W3 are bonded to each other, and the wafer laminate W4 is formed (bonded back-to-back).

In the present embodiment, a wafer 12 located at one end in the lamination direction in the wafer laminate W4 is then thinned as illustrated in FIG. 8(c) (additional thickness reduction). This forms a wafer laminate W4 having the thinned wafer 12. In the present additional thickness reduction, one wafer 12 is thinned to a predetermined thickness, for example, by grinding on the back surface 12b side of the one wafer 12. The thickness of the wafer 12 after thickness reduction is, for example, from 1 to 20 µm.

In the present embodiment, then, as illustrated in FIG. 9(a) and FIG. 9(b), the thinned wafer 11 of the wafer laminate W3 having undergone the thickness reduction described above with reference to FIG. 7(c) is bonded by direct bonding to the thinned wafer 12 of the wafer laminate W4 having undergone the additional thickness reduction (additional bonding). This forms a wafer laminate W4 having an increased number of wafer layers.

Figure 10:
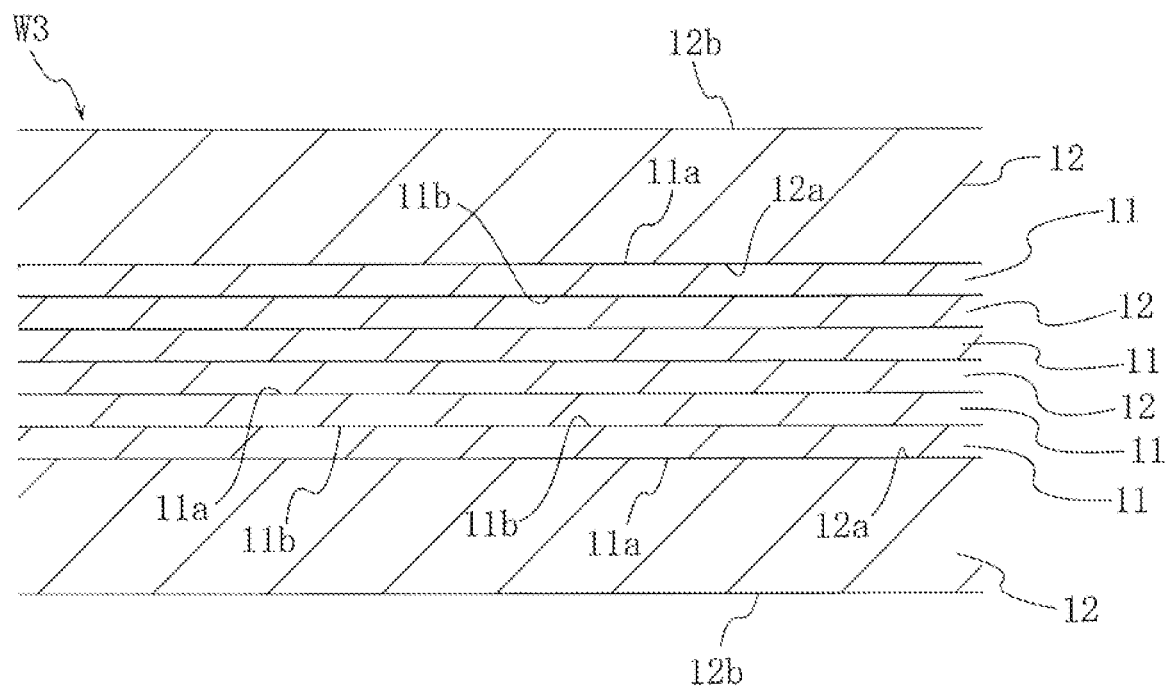
FIG. 10 illustrates some processes in a method of manufacturing a semiconductor device according to an embodiment of the present invention.
Figure 11:
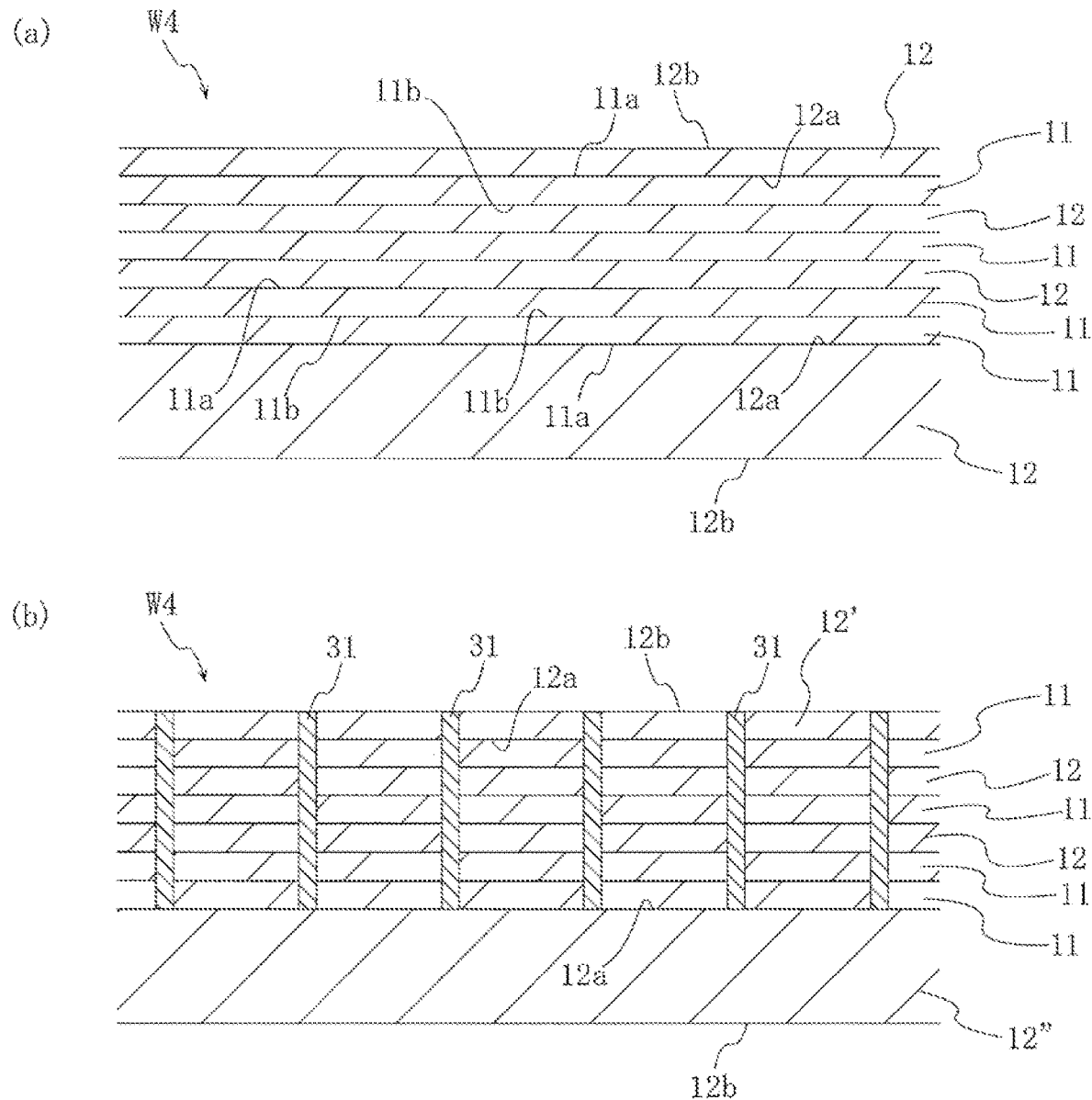
FIG. 11 illustrates some processes in a method of manufacturing a semiconductor device according to an embodiment of the present invention.

In the present method of manufacturing a semiconductor device, a series of processes including the additional thickness reduction (thickness reduction of a wafer 12 at one end of the wafer laminate W4) described above with reference to FIG. 8(c) and the additional bonding (further multilayering of the wafer laminate W4) described above with reference to FIG. 9(a) and FIG. 9(b) is performed a predetermined number of times according to the number of semiconductor elements laminated in a semiconductor device to be manufactured. For each additional thickness reduction, a subsequent additional bonding is performed. FIG. 10 illustrates, as an example, a wafer laminate W4 obtained by performing the series of processes twice.

In the present embodiment, a wafer 12 located at one end in the lamination direction in the wafer laminate W4 is then thinned as illustrated in FIG. 11(a). In the present additional thickness reduction, one wafer 12 is thinned to a predetermined thickness, for example, by grinding on the back surface 12b side of the one wafer 12. The thickness of the wafer 12 after thickness reduction is, for example, from 1 to 20 µm.

Then, as illustrated in FIG. 11(b), through electrode 31 is formed (through electrode forming). The through electrode 31 is to electrically connect semiconductor elements formed in different wafers in the wafer laminate W4. Specifically, the through electrode 31 extends through an inside of the wafer laminate W4 from a back surface 12b of a wafer 12 (wafer 12') located at one end (the upper end in FIG. 11(b)) in the lamination direction in the wafer laminate W4 to an element forming surface 12a of a wafer 12 (wafer 12") located at another end (the lower end in FIG. 11(b)) in the lamination direction in the wafer laminate W4. Such a through electrode 31 can be formed, for example, through: forming an opening from the wafer 12' side in the wafer laminate W4 to the element forming surface 12a of the wafer 12"; forming an insulating film (not illustrated) on an inner wall surface of the opening; forming a barrier layer (not illustrated) on the insulating film surface; forming a seed layer for electroplating (not illustrated) on the barrier layer surface; and filling the opening with a conductive material, such as copper, by an electroplating method. In addition, a technique described, for example, in JP 2016-004835 A may be employed to form the through electrode 31.

Figure 12:
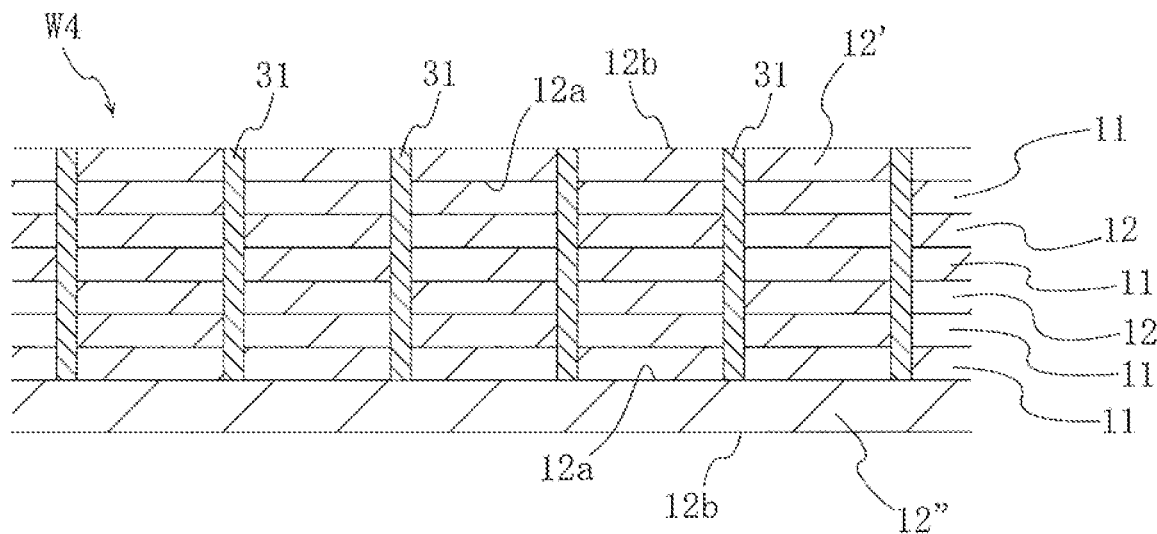
FIG. 12 illustrates some processes in a method of manufacturing a semiconductor device according to an embodiment of the present invention.

In the present embodiment, the wafer 12" in the wafer laminate W4 is then thinned as illustrated in FIG. 12. In the present additional thickness reduction, the wafer 12" is thinned to a predetermined thickness, for example, by grinding on the back surface 12b side of the wafer 12". The thickness of the wafer 12" after thickness reduction is, for example, from 5 to 400 µm. The present additional thickness reduction is preferably performed to reduce the thickness of a semiconductor device to be manufactured.

Thereafter, an external connection bump (not illustrated) may be formed on the back surface 12b side of the wafer 12' in the wafer laminate W4 (external connection bump forming). Alternatively, a through electrode (not illustrated) may be formed, where the through electrode extends through the wafer 12" in the wafer laminate W4 in the thickness direction, and is electrically connected to a multilayered wiring structure portion on the element forming surface 12a side of the wafer 12". And an external connection bump (not illustrated) may be formed on the back surface 12b side of the wafer 12", where the external connection bump is electrically connected to the through electrode.

As described above, the semiconductor device having a three-dimensional structure in which semiconductor elements are integrated in their thickness direction can be manufactured. This semiconductor device may be divided into individual pieces by dicing.

Some of the plurality of direct bonding described above in the present method of manufacturing a semiconductor device may be substituted with a bonding technique using an adhesive, such as, for example, bonding by the adhesive layer 21 described above.

In addition, in the present method of manufacturing a semiconductor device, after the process described above with reference to FIG. 8(c), the through electrode forming described above with reference to FIG. 11(b) and the process described above with reference to FIG. 12 may be performed without undergoing further multilayering of the wafer laminate W4. Thereafter, an external connection bump may be formed.

In the bonding of the present method of manufacturing a semiconductor device, the thinned wafers 11 of two wafer laminates W3 having undergone the thickness reduction described above with reference to FIG. 7(c) are bonded to each other. These wafer laminates W3 each have a laminate configuration including the wafer 12 in addition to the thinned wafer 11. Thus, the wafer laminate W4 formed by the bonding has a laminate configuration symmetric in the thickness direction, the laminate configuration including two wafers 12 and two thinned wafers 11 interposed between the wafers 12 with the element forming surfaces 11a and 12a bonded to each other. The wafer laminate W4 having the laminate configuration symmetric in the thickness direction is less likely to warp. Thus, the present method of manufacturing a semiconductor device is suitable for manufacturing a semiconductor device while preventing warpage of the wafer laminate.

In addition, in at least one additional bonding in the present method of manufacturing a semiconductor device, the thinned wafer 11 side of the wafer laminate W3 having undergone the thickness reduction described above with reference to FIG. 7(c) is bonded to the thinned wafer 12 of the wafer laminate W4 having undergone the additional thickness reduction described above with reference to FIG. 8(c). The wafer laminate W4 formed by each additional bonding also has a laminate configuration symmetric in the thickness direction and is less likely to warp. Thus, the present method of manufacturing a semiconductor device is suitable for manufacturing a semiconductor device while preventing warpage of the wafer laminate.

In addition, the present method of manufacturing a semiconductor device does not use a supporting wafer, which is not included in the wafer laminate to be formed, in the thickness reduction and the subsequent lamination of the wafer 11 having the element forming surface 11a. Thus, the present method of manufacturing a semiconductor device does not require the temporary adhering of the supporting wafer, the removal of the supporting wafer, and the subsequent cleaning of the thinned wafer surface described above with respect to other methods. Such a configuration is preferred in terms of reducing manufacturing costs, such as capital investment costs and costs of materials to be used, and reducing the number of processes in the manufacturing process, and suitable for efficiently manufacturing a semiconductor device.

As described above, the present method of manufacturing a semiconductor device is suitable for efficiently manufacturing a semiconductor device while preventing warpage of the wafer laminate.

In the present method of manufacturing a semiconductor device, as described above, the through electrode 31 is formed, where the through electrode 31 extends through an inside of the wafer laminate W4 from the back surface 12b of the thinned wafer 12' located at one end in the lamination direction in the wafer laminate W4 to the element forming surface 12a of the wafer 12" located at another end in the lamination direction in the wafer laminate W4. Such a through electrode 31 can appropriately electrically connect the semiconductor elements at short distances in a semiconductor device to be manufactured. Thus, the formation of the through electrode 31 is suitable for achieving an efficient digital signal processing, for reducing attenuation of the high-frequency signal, and also for reducing power consumption in a semiconductor device to be manufactured.

EXAMPLE

Example 1

Production of Adhesive Composition

An adhesive composition (adhesive composition C) was prepared by mixing 100 parts by mass of an epoxy group-containing polyorganosilsesquioxane prepared as described below, 115 parts by mass of propylene glycol monomethyl ether acetate, 0.45 parts by mass (in terms of solid content) of an antimony sulfonium salt ("SI-150L (trade name)" available from Sanshin Chemical Industry Co., Ltd.), and 0.01 parts by mass of (4-hydroxyphenyl)dimethylsulfonium methyl sulfite ("SAN-AID SI Auxiliary Agent (trade name)" available from Sanshin Chemical Industry Co., Ltd.).

Synthesis of Polyorganosilsesquioxane

In a 300-mL flask equipped with a reflux condenser, a nitrogen gas inlet tube, a stirrer, and a thermometer, while nitrogen gas was introduced, 161.5 mmol (39.79 g) of 2-(3,4-epoxycyclohexyl)ethyltrimethoxysilane, 9 mmol (1.69 g) of phenyltrimethoxysilane, and 165.9 g of acetone as a solvent were mixed, and the temperature was raised to 50° C. Then, to the mixture, 4.7 g of a 5% potassium carbonate aqueous solution (1.7 mmol as potassium carbonate) was added dropwise over 5 minutes, and then 1700 mmol (30.6 g) of water was added dropwise over 20 minutes. No significant temperature rise occurred in the mixture during the drop-wise addition procedure. After the drop-wise addition procedure, a polycondensation reaction was performed at 50° C. for 4 hours while nitrogen gas was introduced into the flask. A product in the reaction solution after the polycondensation reaction, when analyzed, had a number average molecular weight of 1900 and a molecular weight dispersity of 1.5. In addition, the reaction solution allowed to stand to cool was repeatedly washed with water until a lower layer solution (aqueous phase) generated by a phase separation became neutral, then an upper layer solution was collected. The solvent was distilled off from the upper layer solution under conditions of 1 mmHg and 40° C. until the amount of the solvent became 25 mass %, and a colorless transparent liquid product (epoxy group-containing polyorganosilsesquioxane) was obtained.

Production of Wafer Laminate

A wafer laminate body (second wafer laminate) of the present example was produced through: forming a first wafer laminate; performing thickness reduction to one wafer in the first wafer laminate, and bonding the first wafer laminates having undergone the thickness reduction to each other as described below.

In the forming the first wafer laminate, first, two wafers were prepared. In each wafer, a plurality of semiconductor elements including a multilayered wiring structure portion were fabricated in advance on one side of a silicon wafer main body (a thickness of 775 μm), and the element forming surface has been treated with a silane coupling agent. In the silane coupling agent treatment, a silane coupling agent ("KBE403 (trade name)" available from Shin-Etsu Chemical Co., Ltd.) was coated on the element forming surface of the wafer by spin coating, followed by heating at 120° C. for 5 minutes. In the forming the first wafer laminate, then, the adhesive composition C described above was coated on the element forming surface of one wafer by spin coating, and an adhesive composition layer was formed. Then, the wafer having this composition layer was heated at 80° C. for 4 minutes and then at 100° C. for 2 minutes to dry the adhesive composition layer, and an uncured adhesive layer (a thickness of 2.5 μm) was formed on the element forming surface of the wafer. Then, the wafer having the adhesive layer and the other wafer were affixed together via the adhesive layer under application of pressure, followed by heating at 150° C. for 30 minutes and then at 170° C. for 30 minutes to cure the adhesive layer, and the two wafers were bonded to each other (bonded face-to-face). The affixing was performed under conditions of a temperature of 50° C. and a pressure of 3000 g/cm². As described above, two first wafer laminates were formed.

Then, one wafer in each first wafer laminate was thinned. Specifically, the back surface side of one wafer in the first wafer laminate was ground using a grinder (available from DISCO Corporation), and the wafer was thinned to a thickness of 10 µm. Thereafter, a silane coupling agent ("KBE403 (trade name)" available from Shin-Etsu Chemical Co., Ltd.) was coated by spin coating on the surface (ground surface) of the thinned wafer, followed by heating at 120° C. for 5 minutes (silane coupling agent treatment). As described above, two first wafer laminates in which one wafer of each wafer laminates was thinned were formed.

Then, the two first wafer laminates having undergone the thickness reduction described above were bonded to each other. Specifically, first, the adhesive composition C described above was coated on the back surface of the thinned wafer in one first wafer laminate by spin coating, and an adhesive composition layer was formed. Then, the first wafer laminate having this composition layer was heated at 80° C. for 4 minutes and then at 100° C. for 2 minutes. Thus, the adhesive composition layer was dried, and an uncured adhesive layer (a thickness of 2.5 µm) was formed on the back surface of the thinned wafer of the first wafer laminate. Then, the back surface of the thinned wafer in the first wafer laminate having the adhesive layer and the back surface of the thinned wafer in the other first wafer laminate were affixed together via the adhesive layer under application of pressure. The affixing was performed under conditions of a temperature of 50° C. and a pressure of 3000 g/cm$^2$. Thereafter, the wafer laminates were heated at 150° C. for 30 minutes and then at 170° C. for 30 minutes to cure the adhesive layer, and the two first wafer laminates were bonded to each other (bonded back-to-back).

As described above, a wafer laminate (second wafer laminate) of the present example including four layers of wafers was produced. The wafer laminate of the present example has a symmetric laminate configuration in which the adhesive layer related to the back-to-back bonding described above is a plane of symmetry, and the wafer laminate is suitable for preventing warpage.

To summarize the above, configurations and variations of the present invention are described below.

(1) A method of manufacturing a semiconductor device, the method including:

preparing a plurality of first wafer laminates, each of the first wafer laminates having a laminate configuration, in which a first wafer and a second wafer are included, the first wafer having an element forming surface and a back surface opposite from the element forming surface, and the second wafer having an element forming surface and a back surface opposite from the element forming surface, and the element forming surface sides of the first and second wafers are bonded to each other;

performing thickness reduction, at least twice, to the first wafer of each of the first wafer laminates to form first wafer laminates each having the thinned first wafer; and bonding the thinned first wafer sides of two first wafer laminates having undergone the thickness reduction to each other to form a second wafer laminate.

(2) The method of manufacturing a semiconductor device according to (1), wherein a constituent material of the wafer is silicon (Si), germanium (Ge), silicon carbide (SiC), gallium arsenide (GaAs), gallium nitride (GaN), or indium phosphide (InP).

(3) The method of manufacturing a semiconductor device according to (1) or (2), wherein a thickness of the wafer is from 500 to 1000 µm.

(4) The method of manufacturing a semiconductor device according to any one of (1) to (3), wherein a thickness of the thinned first wafer is from 1 to 20 µm.

(5) The method of manufacturing a semiconductor device according to any one of (1) to (4), wherein the first and second wafers in each of the first wafer laminates are bonded to each other via an adhesive layer or by direct bonding.

(6) The method of manufacturing a semiconductor device according to any one of (1) to (5), wherein in the bonding, the thinned first wafers of the two first wafer laminates are bonded to each other via an adhesive layer or by direct bonding.

(7) The method of manufacturing a semiconductor device according to (5) or (6), wherein the adhesive layer is formed from a polyorganosilsesquioxane-containing thermosetting adhesive.

(8) The method of manufacturing a semiconductor device according to (7), wherein the polyorganosilsesquioxane-containing thermosetting adhesive contains an epoxy group-containing polyorganosilsesquioxane.

(9) The method of manufacturing a semiconductor device according to (8), wherein the epoxy group-containing polyorganosilsesquioxane contains a 2-(3,4-epoxycyclohexyl) ethyl group.

(10) The method of manufacturing a semiconductor device according to any one of (5) to (9), wherein the adhesive layer is cured by heating at 30 to 200° C.

(11) The method of manufacturing a semiconductor device according to any one of (5) to (10), wherein a thickness of the adhesive layer is from 0.5 to 20 µm.

(12) The method of manufacturing a semiconductor device according to any one of (1) to (11), the method further including forming a through electrode, the through electrode extending through an inside of the second wafer laminate from a back surface of a second wafer located at one end in the lamination direction in the second wafer laminate to an element forming surface of a second wafer located at another end in the lamination direction in the second wafer laminate.

(13) The method of manufacturing a semiconductor device according to (12), the method further including performing thickness reduction to the second wafer located at the one end in the lamination direction in the second wafer laminate prior to the forming a through electrode.

(14) The method of manufacturing a semiconductor device according to any one of (1) to (13), the method further including:

performing additional thickness reduction, at least once, to a second wafer located at one end in the lamination direction in the second wafer laminate to form a second wafer laminate having the thinned second wafer; and performing additional bonding, for each of the additional thickness reduction, to bond a thinned first wafer of a first wafer laminate having undergone the thickness reduction to the thinned second wafer of the second wafer laminate having undergone the additional thickness reduction via an adhesive layer or by direct bonding to form a second wafer laminate having an increased number of wafer layers.

(15) The method of manufacturing a semiconductor device according to (14), the method further including forming a through electrode, the through electrode extending through an inside of the second wafer laminate, which has undergone the additional bonding, from a back surface of a second wafer located at one end in the lamination direction in the second wafer laminate to an element forming surface of a second wafer located at another end in the lamination direction in the second wafer laminate.

(16) The method of manufacturing a semiconductor device according to (15), the method further including performing thickness reduction to the second wafer located at the one end in the lamination direction in the second wafer laminate after the additional bonding and prior to the forming a through electrode.

(17) The method of manufacturing a semiconductor device according to any one of (1) to (16), wherein a thickness of the thinned second wafer located at the one end is from 1 to 20 µm.

(18) The method of manufacturing a semiconductor device according to any one of (12) to (17), the method further including performing thickness reduction to the second wafer located at the another end in the lamination direction in the second wafer laminate prior to the forming a through electrode.

(19) The method of manufacturing a semiconductor device according to (18), wherein a thickness of the thinned second wafer located at the another end is from 5 to 400 µm.

INDUSTRIAL APPLICABILITY

The manufacturing method of the present invention is suitable for forming a wafer laminate having a laminate configuration symmetric in the thickness direction without using a supporting wafer. Thus, the present method can efficiently manufacture a semiconductor device while preventing warpage of the wafer laminate. Thus, the present invention has industrial applicability.

REFERENCE SIGNS LIST

W1, W3 Wafer laminate (first wafer laminate)
W2, W4 Wafer laminate (second wafer laminate)
11 Wafer (first wafer)
12, 12', 12" Wafer (second wafer)
11a, 12a Element forming surface
11b, 12b Back surface
21 Adhesive layer
31 Through electrode

The invention claimed is:

1. A method of manufacturing a semiconductor device, the method comprising:
preparing a plurality of first wafer laminates, each of the first wafer laminates having a laminate configuration, in which a first wafer and a second wafer are included, the first wafer having an element forming surface and a back surface opposite from the element forming surface, and the second wafer having an element forming surface and a back surface opposite from the element forming surface, and the element forming surface sides of the first and second wafers are bonded to each other;
performing thickness reduction, at least twice, to the first wafer of each of the first wafer laminates to form first wafer laminates each having the thinned first wafer; and
bonding the thinned first wafer sides of two first wafer laminates having undergone the thickness reduction to each other to form a second wafer laminate.

2. The method of manufacturing a semiconductor device according to claim 1, wherein the first and second wafers in each of the first wafer laminates are bonded to each other via an adhesive layer or by direct bonding.

3. The method of manufacturing a semiconductor device according to claim 1, wherein in the bonding, the thinned first wafers of the two first wafer laminates are bonded to each other via an adhesive layer or by direct bonding.

4. The method of manufacturing a semiconductor device according to claim 2, wherein in the bonding, the thinned first wafers of the two first wafer laminates are bonded to each other via an adhesive layer or by direct bonding.

5. The method of manufacturing a semiconductor device according to claim 1 the method further comprising forming a through electrode, the through electrode extending through an inside of the second wafer laminate from a back surface of a second wafer located at one end in the lamination direction in the second wafer laminate to an element forming surface of a second wafer located at another end in the lamination direction in the second wafer laminate.

6. The method of manufacturing a semiconductor device according to claim 4, the method further comprising performing thickness reduction to the second wafer located at the one end in the lamination direction in the second wafer laminate prior to the forming a through electrode.

7. The method of manufacturing a semiconductor device according to claim 1 the method further comprising:
performing additional thickness reduction, at least once, to a second wafer located at one end in the lamination direction in the second wafer laminate to form a second wafer laminate comprising the thinned second wafer; and
performing additional bonding, performed for each of the additional thickness reduction, to bond a thinned first wafer of a first wafer laminate having undergone the thickness reduction to the thinned second wafer of the second wafer laminate having undergone the additional thickness reduction, via an adhesive layer or by direct bonding, to form a second wafer laminate having an increased number of wafer layers.

8. The method of manufacturing a semiconductor device according to claim 6, the method further comprising forming a through electrode, the through electrode extending through an inside of the second wafer laminate, which has undergone the additional bonding, from a back surface of a second wafer located at one end in the lamination direction in the second wafer laminate to an element forming surface of a second wafer located at another end in the lamination direction in the second wafer laminate.

9. The method of manufacturing a semiconductor device according to claim 7, the method further comprising performing thickness reduction to the second wafer located at the one end in the lamination direction in the second wafer laminate after the performing additional bonding and prior to the forming a through electrode.

10. The method of manufacturing a semiconductor device according to claim 5, the method further comprising performing thickness reduction to the second wafer located at the another end in the lamination direction in the second wafer laminate after the forming a through electrode.

11. The method of manufacturing a semiconductor device according to claim 6, the method further comprising performing thickness reduction to the second wafer located at the another end in the lamination direction in the second wafer laminate after the forming a through electrode.

12. The method of manufacturing a semiconductor device according to claim 8, the method further comprising performing thickness reduction to the second wafer located at the another end in the lamination direction in the second wafer laminate after the forming a through electrode.

13. The method of manufacturing a semiconductor device according to claim 9, the method further comprising performing thickness reduction to the second wafer located at the another end in the lamination direction in the second wafer laminate after the forming a through electrode.

14. The method of manufacturing a semiconductor device according to claim 1, wherein a thickness of the thinned first wafer is from 1 to 20 μm.

15. The method of manufacturing a semiconductor device according to claim 2, wherein the adhesive layer is formed from a polyorganosilsesquioxane-containing thermosetting adhesive.

16. The method of manufacturing a semiconductor device according to claim 15, wherein the polyorganosilsesquioxane-containing thermosetting adhesive contains an epoxy group-containing polyorganosilsesquioxane.

17. The method of manufacturing a semiconductor device according to claim 16, wherein the epoxy group-containing polyorganosilsesquioxane contains a 2-(3,4-epoxycyclohexyl)ethyl group.

18. The method of manufacturing a semiconductor device according to claim 15, wherein a thickness of the adhesive layer is from 0.5 to 20 μm.

19. The method of manufacturing a semiconductor device according to claim 6, wherein a thickness of the thinned second wafer located at the one end is from 1 to 20 μm.

20. The method of manufacturing a semiconductor device according to claim 10, wherein a thickness of the thinned second wafer located at the another end is from 5 to 400 μm.

* * * * *